(12) United States Patent
Marion et al.

(10) Patent No.: US 8,058,656 B2
(45) Date of Patent: Nov. 15, 2011

(54) METHOD FOR PRODUCING A MATRIX OF INDIVIDUAL ELECTRONIC COMPONENTS AND MATRIX PRODUCED THEREBY

(75) Inventors: Francois Marion, Saint Martin le Vinoux (FR); Olivier Gravrand, Fontanil Cornillon (FR)

(73) Assignee: Commissariat a l'Energie Atomique, Paris (FR)

( * ) Notice: Subject to any disclaimer, the term of this patent is extended or adjusted under 35 U.S.C. 154(b) by 331 days.

(21) Appl. No.: 12/330,805

(22) Filed: Dec. 9, 2008

(65) Prior Publication Data
US 2009/0085045 A1 Apr. 2, 2009

Related U.S. Application Data

(63) Continuation of application No. PCT/FR2007/051618, filed on Jul. 9, 2007.

(30) Foreign Application Priority Data

Jul. 12, 2006 (FR) ...................................... 06 52926

(51) Int. Cl.
*H01L 21/82* (2006.01)
(52) U.S. Cl. ... 257/79; 257/506; 257/428; 257/E21.602; 257/E25.004; 438/128; 438/129

(58) Field of Classification Search ................... 257/79, 257/506, 428, E21.602, E25.01, E25.004, 257/E25.019; 438/128, 129
See application file for complete search history.

(56) References Cited

U.S. PATENT DOCUMENTS

| 5,027,182 | A  | * | 6/1991 | Kim et al. ..................... 257/570 |
| 5,862,844 | A  | * | 1/1999 | Perrin ............................ 141/351 |
| 6,547,249 | B2 | * | 4/2003 | Collins et al. ................... 257/88 |
| 6,743,982 | B2 |   | 6/2004 | Biegelsen |
| 2006/0060954 | A1 | | 3/2006 | Meyer-Berg |

FOREIGN PATENT DOCUMENTS
EP 1 583 147 A2 10/2005
* cited by examiner

*Primary Examiner* — Thinh T Nguyen
(74) *Attorney, Agent, or Firm* — Burr & Brown

(57) ABSTRACT

The invention relates to a method for producing a matrix of electronic components, comprising a step of producing an active layer on a substrate, and a step of individualizing the components by forming trenches in the active layer at least until the substrate emerges. The method comprises steps of depositing a layer of functional material on the active layer, depositing a photosensitive resin on the layer of material in such a way as to fill said trenches and to form a thin film on the upper face of the components, at least partially exposing the resin to radiation while underexposing the portion of resin in the trenches, developing the resin in such a way as to remove the properly exposed portion thereof, removing the functional material layer portion that shows through after the development step, and removing the remaining portion of resin.

20 Claims, 7 Drawing Sheets

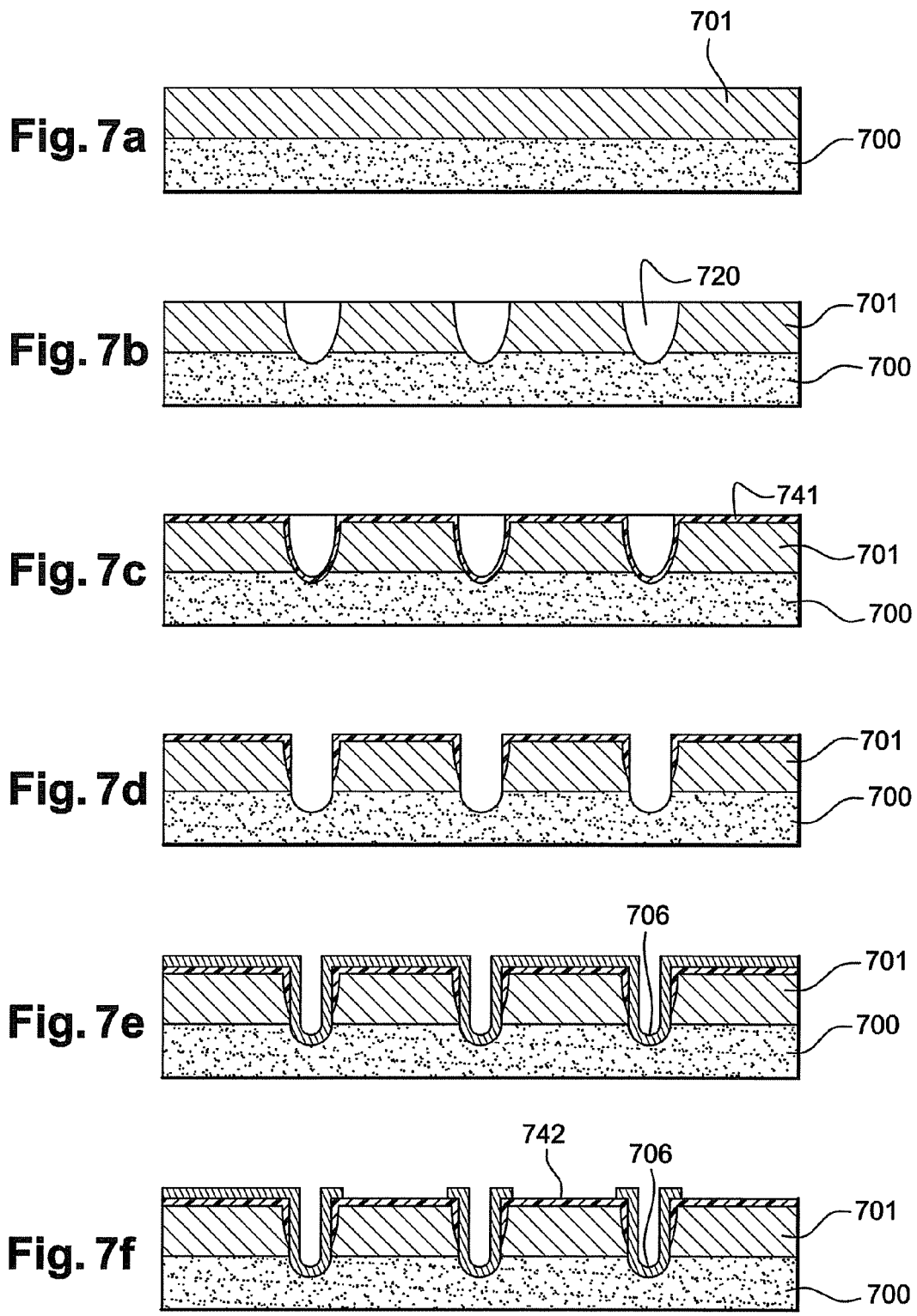

METHOD FOR PRODUCING A MATRIX OF INDIVIDUAL ELECTRONIC COMPONENTS AND MATRIX PRODUCED THEREBY

FIELD OF THE INVENTION

This invention relates to the field of the integration of individualized electronic components and to the functional densification of the surfaces of integrated circuits comprising such electronic components.

The invention relates more particularly to a method for producing a matrix of individual electronic components, of the type that comprises a step of manufacturing an active layer on a substrate base, particularly by epitaxy, and a step of individualizing said components by forming trenches, particularly by etching, in the active layer, at least until the substrate base emerges.

The invention also relates to a matrix of at least two electronic components individualized in an active layer by means of through trenches formed therein.

BACKGROUND OF THE INVENTION

In an electronic matrix device, such as a matrix detector for example, the unitary elements forming the matrix, or "pixels" by analogy with the field of imaging, are individualized by trenches in order to define independent local behaviours. For example, in the case of a matrix detector, an individual component allows incident radiation thereon to be measured independently of the other components, thereby allowing in the end an image of distinct dots to be formed.

The inter-component space so defined is generally perceived as a drawback, not only because it restricts the degree of component integration per surface unit, but also because this volume is considered to be difficult to use with common techniques without damaging the behaviour of adjacent components or inducing a high failure rate.

By way of example, electrical connections between adjacent components have been made using electric wires welded onto the upper faces of the components. A welded wire however is fragile by virtue of the weld employed, and in addition uses a portion of the working surface of the components.

The purpose of this invention is to resolve the aforementioned problem by proposing a matrix of individual components and a method for the production thereof, wherein the inter-component space is used optimally, for example in order to provide reliable electrical connections between adjacent pixels, to absorb relative displacements between adjacent pixels or to increase pixel density by reducing the surfaces occupied by the interconnections.

It will be noted that the invention applies to the field of the manufacture of matrices of electronic components, whereof some dimensions, particularly those relating to the space separating the components, are less than about ten micrometers. As is known, the manufacture of such components is subject to specific problems which require the implementation of techniques specific to these orders of magnitude, such as photolithography for example.

SUMMARY OF THE INVENTION

To this end, the object of the invention is a method for producing a matrix of individual electronic components, of the type that comprises a step of producing an active layer on a substrate base, particularly by epitaxy, and a step of individualizing said components by forming trenches, particularly by etching, in the active layer, at least until the substrate base emerges.

According to the invention, the method comprises steps of:
depositing a layer of functional material on the active layer;
depositing a resin photosensitive to a preset radiation on the layer of functional material in such a way as to fill said trenches and to form a thin film on the upper face of the electronic components;
at least partially exposing the resin to said radiation while underexposing the portion of resin filling the trenches;
developing the resin in such a way as to remove the properly exposed portion thereof;
removing the functional material layer portion that shows through after the development step; and
removing the remaining portion of resin.

In other words, the layer of functional material is protected by the resin filling the trenches during the steps consequent upon exposure. Indeed, the fact of underexposing the resin in the trenches prevents the development thereof. In fact, once operations to functionalize the electronic components are complete (etching, ion attack, etc.), the layer of functional material in the trenches is intact. Thus, after the resin in the trenches is removed, for example by chemical bath, a film of functional material is obtained that connects the adjacent electronic components.

It can then be seen that this film exactly fills the space separating the adjacent components covering particularly the sides or lateral faces of said components.

If consideration is given, for example, to using the component matrix in a matrix detector, hybridizing it to a substrate (using the well-known so-called "flip-chip" technology for example), and then shrinking the substrate base, a matrix of electronic components is obtained that is connected by bridges of functional material exactly equal in width to the trenches.

Many applications are then possible.

For example, it is conceivable for the bridges so produced to be used to resolve problems of relative displacement between adjacent components by opting for resilient bridges (opting for example to make them of no great thickness). This is particularly advantageous in the event of the bridges also being used as electrical interconnections between components. Indeed, these interconnections will go on being provided whatever the magnitude of the relative displacements between adjacent components. For example, in opting to have the bridge of no great thickness, said bridge will behave like a strip or a flexible film, which has a significant magnitude of distortion generally greater than the magnitude of any relative displacements that may be sustained by electronic components in use.

For example, if the functional material is conductive, the bridges may be used for the electrical interconnection of the components. This electrical interconnection may be formed on the side of the components, thereby leaving the upper surface thereof free.

In another application example, if the bridges are made of an opaque material, perfect optical isolation of the components is obtained, thereby preventing an extraneous noise known as "cross-talk" and commonly found in matrix detectors. Indeed, no radiation can reach the trenches which are protected by the bridges. The radiation detected corresponds exactly therefore to the incident radiation on the detection surfaces of the electronic components.

It will be further noted that the invention finally implements what used commonly to be regarded as a defect in the field of the manufacture of micrometric matrix devices.

Functional patterns on the surface of electronic components separated by trenches, such as metallization areas for example, are commonly formed using a radiation-based subtractive technique. The term subtractive here refers to the concept according to which an extensive layer of functional material is deposited on the surface of the components, and the surplus functional material is removed to form the patterns. Photolithography may in particular be cited in this respect.

Taking the example of this technique, the extensive layer of functional material is coated with a photosensitive resin, and then ultra-violet (UV) radiation is applied to it through a subtraction mask defining the material layer portions to be removed in order to form the functional patterns. Under the effect of the UV radiation, the positive resin portion exposed sustains a chemical transformation which allows it to be removed through a development process using a basic solution.

Once the development has been performed, the portions of the material layer that are to be removed then show through and are removed by chemical etching. At the same time, the non-exposed resin has not been removed by the development and therefore protects the material of the patterns from the etching. Once this non-exposed resin portion has been removed by a chemical bath, the functional patterns required then appear on the surface of the electronic components.

But, as is well known, to form micrometric patterns by masking, the radiation wavelength must be smaller than the dimensions of the patterns, particularly if diffraction phenomena are to be avoided when the radiation passes through the mask; and hence the use of ultraviolet radiation to form micrometric patterns. However, the smaller the radiation wavelength is, the lower the penetrating capacity of the radiation into the resin, or the lower the depth of field.

Since the resin filling the trenches is of significant thickness, it is not exposed in its entirety and cannot therefore be fully removed by development. Thus, unwanted material at the bottom of the trenches cannot be removed by the chemical etching consequent upon exposure.

Until then, any depositing of functional material in the so-called deep trenches has been avoided, given that it would be impossible to remove it by etching.

The invention therefore uses to advantage what used to be regarded in the prior art as a defect in manufacturing link elements that exactly cover the trenches, by knowingly depositing functional material in the trench bottom.

According to the invention, the method comprises one or more of the following advantageous characteristics:
the functional material is resilient and/or conductive and/or opaque, depending on the applications envisaged;
the exposure step comprises a step of applying a photolithography mask to the surface of the photosensitive resin;
the photolithography mask comprises portions for covering the trenches;
the exposure step comprises a step of selecting a depth of field for the radiation to which the resin is exposed, that is smaller than the depth of the trenches, and greater than the thickness of the resin film coating the upper face of the electronic components;
the active layer production step is followed by a step of depositing and/or implanting on the free surface of said active layer functional elements characteristic of said components;
the step of depositing and/or implanting functional elements comprises a step of depositing and/or implanting an electrode and/or a metallization layer allowing each component to be hybridized;
the active layer is a semi-conductor layer of a first type, and the step of depositing and/or implanting functional elements comprises a step of forming a semi-conductor area of a second type for each component in the free surface of the active layer;
the step of individualizing said components by forming trenches comprises, or is followed by, a step of forming a semi-conductor area of the second type in at least one lateral face of each component;
the step of forming semi-conductor areas of the second type in said lateral edges is implemented by doping, particularly "loophole" doping ("loophole" doping being etching by ion bombardment which simultaneously dopes the material);
the functional material is metal, and the photolithography mask is selected in such a way as to form a metal layer on the surface of the semi-conductor areas of the second type formed on the free surface of the active layer;
the method comprises a step of producing a conductive bump contact on the surface of each of said metal layers;
the method comprises, consequent upon the development step, a step of hybridizing the matrix on a substrate.

Another object of the invention is a matrix of at least two electronic components individualized in an active layer by means of through trenches formed therein.

According to the invention, this matrix comprises, for each pair of adjacent electronic components, at least one element connected to said components, at least partially covering the trench separating said components, and comprising at least one point of contact with each of the lateral walls defining said trench.

In other words, the link element between adjacent components comprises at least one portion extending over the whole length of the trench. Optimal use is therefore made of the inter-component space.

According to particular embodiments, the matrix comprises one or more of the following characteristics:
each component has overall the shape of a regular polygon, particularly a parallelepiped shape based on a rectangle, a hexagon, a triangle or the like;
the link element is opaque;
the link element is of sufficient resilience to maintain the integrity of the electrical connection with an adjacent component despite a relative displacement between components;
the link element is conductive;
the link element is filiform;
the link element is surface-based;
the link element is in contact with an electrical contact pickup of the component or components;
said contact pickup is formed on one of the lateral faces or on one of the transverse faces of the component under consideration:
the link element is constituted of several layers, including an electrical conduction layer and a cohesion layer intended to allow assembly on the contact pickup; the external layer is to advantage constituted of a material selected from the group comprising titanium (Ti), chrome (Cr) and an alloy (TiW) of titanium and tungsten, and the conduction layer is to advantage constituted of a material selected from the group comprising platinum, gold, aluminium, copper or an alloy of copper and beryllium;
the link element is common to all or part of said components and forms a continuous line or a grid.

each electronic component is a bipolar transistor, whereof at least one semi-conductor area is formed in one of the lateral faces thereof and is in contact with said link element.

Another object of the invention is a method for producing an electronic device comprising a plurality of electronic components added to a substrate.

According to the invention, this method comprises:
producing an active layer by epitaxy on a sacrificial stratum;
depositing and/or implanting on the free surface of said active layer functional elements characteristic of said components, such as an electrode, particularly an anode, and/or a metallization layer allowing each component to be hybridized;
etching trenches in rows and/or in columns in said active layer at least until said stratum emerges, in such a way as to individualize said components within a matrix;
producing an electrically conductive bump contact on at least one of the free faces of each component so individualized, in such a way as to produce contact pickups;
producing by deposition at least one electrically conductive film extending over said trenches in such a way as to connect at least in twos said contact pickups of adjacent components, said film being of a set thickness in order to give it sufficient resilience to maintain the electrical connection despite a relative displacement between components;
hybridizing the components on the substrate;
selectively thinning down the faces of each component located facing said substrate, in such a way as to leave all or part of said functional elements in projection;
removing said stratum by mechanical machining or chemical attack, in such a way that the electrically conductive film emerges,
said steps of producing the active layer, etching trenches and depositing the at least one film being in accordance with the aforementioned method.

According to particular embodiments of the invention, the method comprises one of more of the following characteristics:
Thus, to advantage, the deposition step comprises:
depositing a layer of electrically insulating material covering the whole surface of said active layer, namely that of the trench and that of said components;
piercing said layer of electrically insulating material by photolithography followed by an etching operation performed at the bottom and over all or part of the edges of said trench;
depositing said electrically conductive film on all or part of the free surface of said components and said trenches;
locally removing said electrically conductive film by etching the surfaces of said components.

Furthermore, and to advantage, the conductor obtained is constituted of several layers, including an electrical conduction layer and a cohesion layer intended to allow assembly on the contact pickup, the removal step being carried out under a plasma selected in such a way as to be inert at least as regards said conduction layer.

A further object of the invention is an electronic device comprising a plurality of electronic components added to a substrate, each component being mechanically connected to said substrate by means of a link element, wherein each component is additionally electrically connected to at least one adjacent component by means of at least one part forming a conductor. According to the invention, the components and associated conductors thereof form a matrix of the aforementioned type.

According to particular embodiments, the device comprises one or more of the following characteristics:
the contact pickup is formed on the component face opposite the component face applied onto the substrate;
the contact pickup is formed on the component face applied onto to said substrate.

Another object of the invention is a detector of electromagnetic radiation, such as X-rays, infrared or visible light. According to the invention, such a detector comprises a matrix formed by a device as previously described, wherein each component comprises a material able to interact with this radiation.

Another object of the invention is an emitter of electromagnetic radiation, such as laser beams, comprising a matrix formed by a device as previously described, wherein each component is constituted by a vertical-cavity surface-emitting laser emitter (VCSEL) or a light-emitting diode (LED).

BRIEF DESCRIPTION OF THE DRAWINGS

The invention will be better understood by reading the following description, given solely by way of example, and produced in relation to the appended drawings, wherein identical reference numbers relate to identical or similar elements, and wherein:

FIGS. 7a to 7f are diagrammatic representations in cross-section of some steps in one embodiment of the method of manufacturing the devices in FIGS. 3 and 4;

DETAILED DESCRIPTION OF THE INVENTION

Figure 1A:
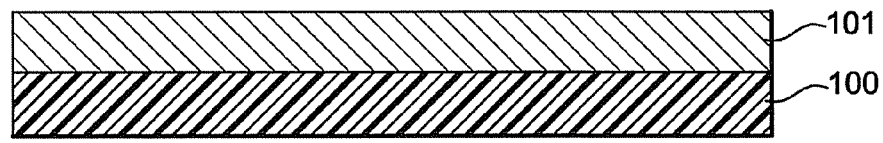
FIGS. 1a to 1h show a method of manufacturing individual electronic components connected by bridges, in accordance with the invention.
Figure 1B:
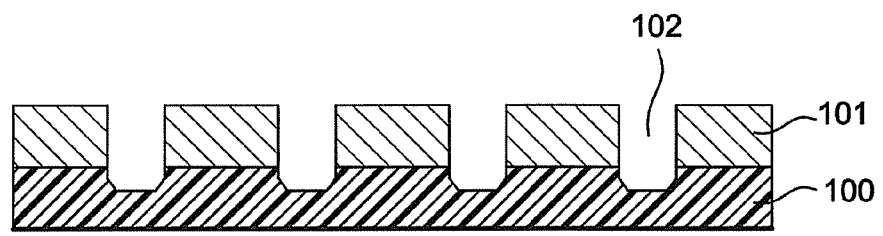

Embodiment of the Method According to the Invention

FIGS. 1a to 1h show the different successive steps of one embodiment of the method for producing a matrix of micrometric electronic components according to the invention. In accordance with the invention, the method firstly comprises producing (FIG. 1a) an active layer 101, for example by epitaxy, on a substrate base 100. The layer 101 is said to be active, since it is necessary to the main function of the electronic components to be produced. The layer 101 is for example made out of a so-called detection or emission material such as CdHgTe, InSb, AsGa, Si, Ge or again multiple quantum wells.

The next step is then to etch (FIG. 1b) trenches 102 in rows and in columns in the active layer 101, at least until the substrate base 100 emerges, in such a way as to individualize components 111 in the matrix to be produced. The etching is for example ion etching, reactive plasma etching or chemical etching.

A film of a functional material 103 is then deposited (FIG. 1c), using the so-called "liftoff" technique for example, on the surface of the active layer 101 so etched. The film 103 is for example constituted of TiPdAu, TiNiAu, TiPt, CrPdAu, OrNiAu, CrPt, Al, CuBe. In some cases, the layer forming the film may be composed of different materials, for example a first material at the bottom of the trenches, chosen for its good level of resilience, and a second material on the surface, chosen for its suitability for being welded.

A photosensitive resin 104 is deposited (FIG. 1d) on the functional film 103 in such a way as to fill the trenches 102 and to form a thin film 105 on the upper face of the components 111. The descriptive term thin here refers to the concept by which the thickness of the film is sufficiently small for the radiation used for a chemical modification of the resin, necessary to its development, to penetrate fully into the film 105 such that the film portions exposed are fully removed during the subsequent development.

A photolithography mask 107 is applied (FIG. 1e) facing the resin 104, and the whole is subjected to ultraviolet radiation 108 through the mask 107. The depth of field of the ultraviolet radiation is selected in such a way as to penetrate the film 105 over its entire thickness, but conversely, not the resin over its entire depth inside the trenches 102. As is known per se in the field of photolithography, only properly exposed resin portions are subject to a chemical reaction. The underexposed portions, such as those located under the mask 107 and those filling the trenches 102 are not subject to such a reaction.

Figure 1C:
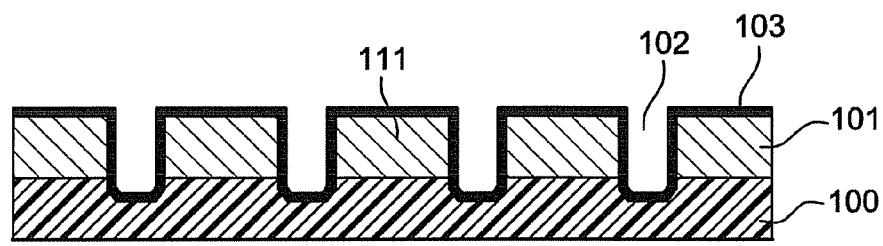
Figure 1D:
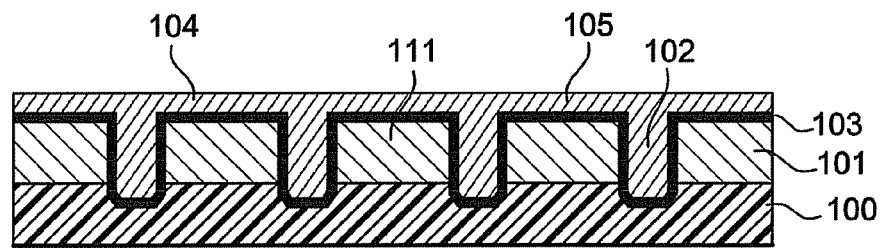
Figure 1E:
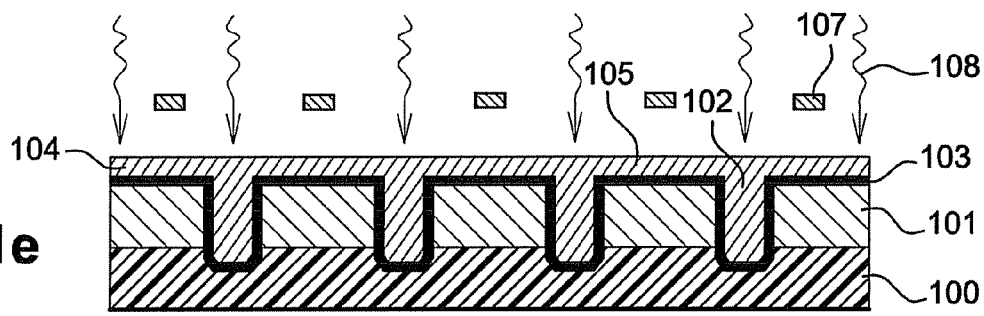

In the example in FIG. 1e, the trenches are not masked. As an alternative, the photolithography mask 107 masks said trenches 102. There is therefore no need to control the radiation in order to define its depth of field with accuracy.

Figure 1F:
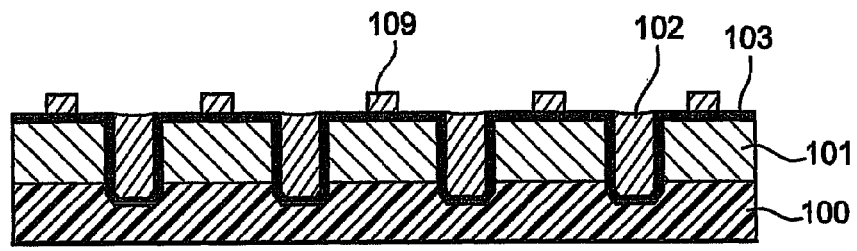
Figure 1G:
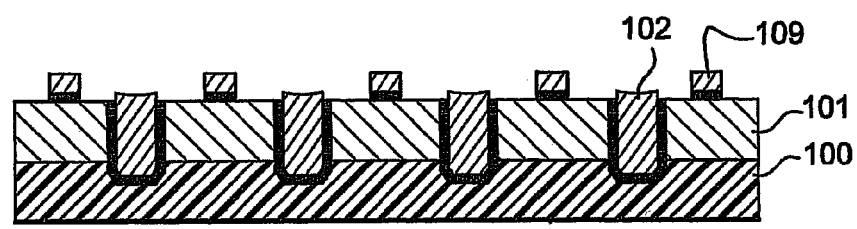
Figure 1H:
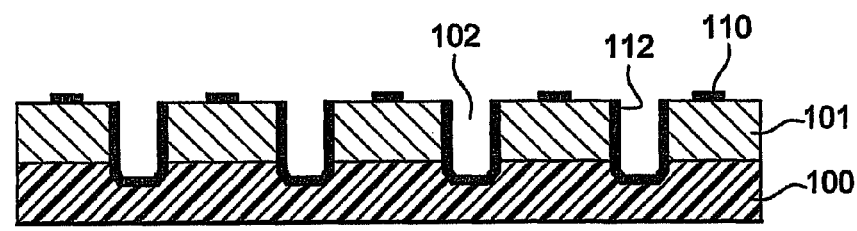

Once exposure has occurred, the properly exposed resin is developed (FIG. 1f). At the end of this step, only the resin portions masked 109 by the mask 107 and those filling the trenches 102 remain.

The portions of the functional film 103 left showing by the disappearance of resin are then etched (FIG. 1g) by chemical attack, following the development step, and the residual resin is then removed (FIG. 1h) by a chemical bath.

At the end of this step, there then exists, between two adjacent components 111, a bridge 112 exactly following the walls of the trenches 102, and an area of film 110 on the upper face of each component 111.

It will be noted that it is unimportant in some applications to control with accuracy the depth of penetration of the UV radiation in the resin of the trenches. What matters is that, at the end of the development process, there remains a film of protective resin 104 on functional film 103 deposited in the trenches 102.

An embodiment of the method has been described wherein an area of film 110 of functional material is produced on the upper face of each component 111.

This embodiment is particularly useful for the production of multiple electrical connections. Indeed, by choosing a conductive functional material, an interconnection by bridge between each pair of adjacent components 111 and an area of connection on the upper face of each component 111 are then obtained.

In the event of it not being required to retain an area of functional material on the upper face of the components 111, the photolithography mask 107 used during the exposure step is pointless. The whole surface of the resin 104 is then exposed, and once the resin has been developed, the entire upper face of the components is etched.

Likewise, an embodiment has been described, wherein no functionalization of the components, apart from the areas 110 of film, is performed. Intermediate steps can be performed as a function of needs in order to deposit or implant other functional elements characteristic of the components as will be described in the application examples below.

Figure 1I:
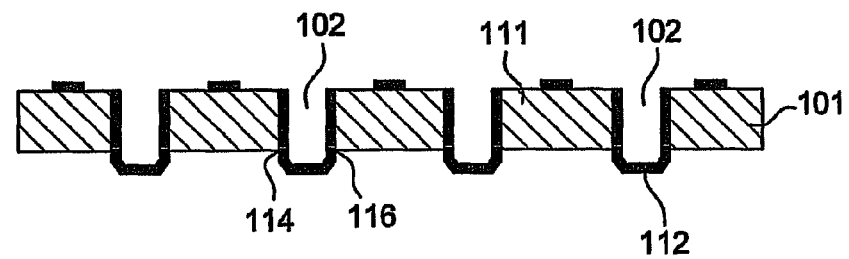
FIG. 1i is a diagrammatic view of a matrix of electronic components according to the invention.

In accordance with the invention and as shown in FIG. 1i, a matrix of electronic components 111 individualized in an active layer 101 is thus obtained using through trenches 102 formed therein. The matrix of the invention comprises, for each pair of adjacent electronic components 111, at least one element 112 connected to said components 111, at least partially covering the trench 102 separating said components, and comprising at least one point of contact 114, 116 with each of the lateral walls defining said trench 102.

The elements 112, namely bridges in the example in FIG. 1i, can assume various forms and dimensions depending on the shape of the trenches 102 etched in the active layer 101 and on the process for depositing the functional material film shown in FIG. 1c. For example, the film can be deposited in such a way as to form a filiform element.

The matrix of electronic components formed by the components 111 and the bridges 112 and obtained using the method of the invention, can give rise to a great many applications.

It can be used as such, keeping or not keeping the substrate base 100, and/or hybridized on electronic circuits.

Other characteristics and advantages of the invention will emerge more clearly in relation to the applications described below.

First Particular Application of the Method and Matrix According to the Invention FIGS. 3 to 7 show an application example of the invention in the field of electronic matrix devices, whereof the matrices of individualized electronic components are hybridized on a substrate. FIGS. 3-7 show in particular an application with a matrix detector, whereof the matrix of unitary detector elements is added to a sensing substrate.

When assembling or using electronic devices, such as those composing a matrix detector, a problem of differential expansion between the assembled elements may be encountered. Any such differential expansion phenomena that occur during the assembly or hybridization of the elements are to be avoided, in so far as they impair the operation of the electronic device. Indeed, they generally cause the electrical connections between components to fail, due to the thermomechanical stresses that occur when cooling the assembled electronic device.

Among the methods for assembling microelectronic components with a substrate described in the prior art, solutions have been proposed to these differential expansion phenomena that occur during assembly, which is generally carried out by welding or brazing at a relatively high temperature.

Nonetheless, although these prior art methods do provide a solution to the differential expansion that occurs during hybridization of the device, the microelectronic devices so assembled do not always tolerate the differential expansion that occurs during use of the microelectronic device. In fact, the temperatures at which a microelectronic device is used may differ substantially from the temperature at which it was hybridized.

Consequently, if the microelectronic device assembled according to one of these prior art methods is, to a greater or lesser degree, free from differential expansion during assembly or hybridization, it must nonetheless withstand mechanical stresses due to any differential expansion that occurs when it is in use. These stresses can even bring about the failure of the electrical connections between their constituent elements, and therefore, the operational failure thereof.

Thus, it is possible to assemble electronic components at ambient temperature limiting or removing residual expansion stresses, but due to the very low working temperature, −200° C. for example, at which the device may be used, differential expansion may cause excessive relative displacement between components, leading to the failure of their electrical connections, particularly at the ends of the microelectronic device.

Two solutions have been proposed in the prior art to make such a microelectronic device resistant to the mechanical stress caused by differential expansion during the utilization stage of the device. These two solutions, similar in their principle, are shown in FIGS. 2a and 2b respectively.

Figure 2A:
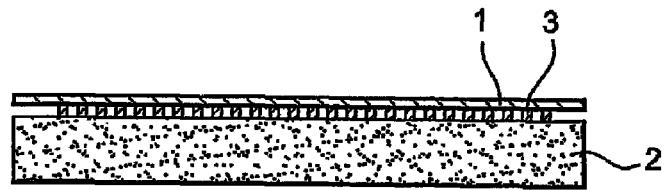
FIGS. 2a and 2b are diagrammatic representations in cross-section of a prior art electronic device.
Figure 2B:
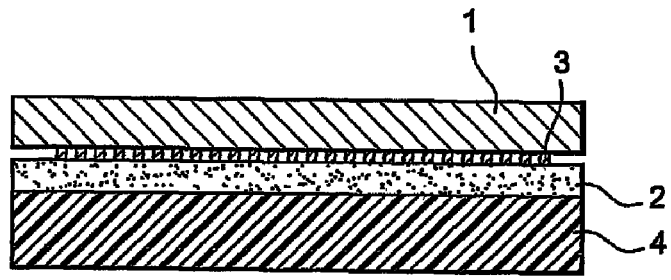

In the example in FIG. 2a, the electronic device comprises a substrate 2, forming for example a sensing circuit for a matrix detector, and a set of electronic components 1, for example "pixels" made out of a semi-conductor material, linked mechanically and connected electrically by means of electrical connection elements 3 such as brazing balls. The assembly shown in FIG. 2a may for example be obtained by the well-known "flip-chip" assembly method.

In the electronic device shown in FIG. 2a, the layer of material forming the set of components 1 is thinned down in such a way as to reduce the mechanical stresses sustained by the connection elements 3 when any differential expansion occurs during the utilization stage of the device. Although such a thin layer structure does actually reduce the risk of the electrical connection elements 3 failing, it increases in return the mechanical and thermal stresses in the thin layer of the set of electronic components 1, which amounts in fact to shifting the problem posed by such stresses to said layer.

Consequently, the thin layer of the set of electronic components 1 has to sustain high levels of stress and, therefore, it must be designed and produced with great attention to detail and thereby at greater cost. Thus, its constituent materials must be selected in such a way as to make it resistant to such stresses, a choice which right away rules out the use of inappropriate materials thereby limiting the electronic functions that can be performed by such a thin layer of the set of electronic components 1.

FIG. 2b shows another prior art solution which involves thinning down the material layer 2, constituting a substrate for example, and superimposing a layer 4 thereon. Such a structure makes it possible to substantially reduce the stresses sustained by the electrical connection elements 3, but, as in the case in FIG. 2a, this amounts to increasing the mechanical and thermal stresses that come into play during the utilisation stages on the material layer 2. Apart from the consequences already mentioned in relation to FIG. 2a, this structure further burdens the manufacturing cost.

Additionally, an electronic device that has the structure of a device as in one of the FIG. 2a or 2b represents the maximum degree to which its electronic components can be miniaturized. Indeed, in so far as each pixel requires a set number of electrical connections, the device is dependent on the space required to implant the electrical connection elements 3 forming these electrical connections.

Thus, for a number of electromagnetic radiation detectors constituted by such electronic devices, each pixel must comprise at least two electrical connections, namely a pixel-specific connection and a connection common to all the pixels. In fact, the current trend is for the miniaturization of the microelectronic components, particularly in the field of detectors or matrix emitters.

There follows a description of devices and a method for the manufacture thereof that do not have the prior art drawbacks that have just been disclosed. Thus, one of the applications of the invention relates to an electronic device, whereof the electrical connections present no risk of failure at the utilization stage, on the one hand, and whereof the fineness of the electronic components is not restricted by the space required by these electrical connections, on the other hand.

Figure 3:
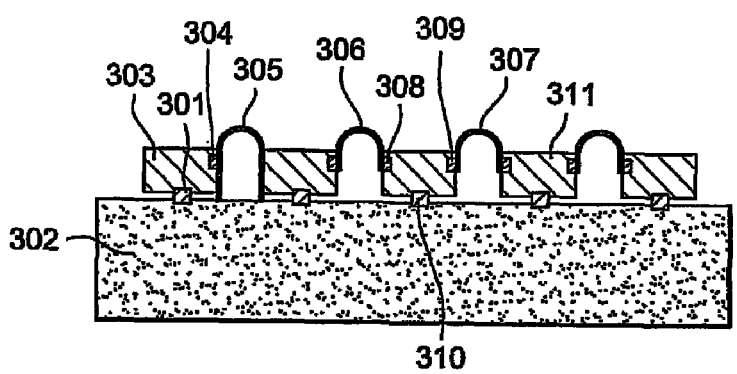
FIG. 3 is a diagrammatic representation in cross-section of a first electronic device comprising a matrix of electronic components in accordance with the invention.

FIG. 3 shows a first embodiment of an electronic device comprising a plurality of individualized electronic components 303, 311 obtained by the method of the invention, and which are added to a substrate 302.

In the example in FIG. 3 as in the following figures, the electronic components 303, 311 consist of a material able to interact with an electromagnetic radiation for detection, and for example an alloy of cadmium (Cd), mercury (Hg) and tellurium (Te), suitable for detecting infrared beams. Nonetheless, the electronic components may be of another type and fulfill other functions, such as the detection or emission of other forms of radiation such as X-rays, visible (LED), laser (VCSEL) etc. In fact, most detectors and emitters are involved.

The substrate itself 302 may be constituted by a semiconductor circuit of the CMOS type, as is generally the case for matrix detectors of electromagnetic radiation.

Each electronic component 303, 311 is mechanically linked and electrically connected to the substrate 302 by means of a link element 301, 310, such as a brazing ball used as part of a "flip-chip" assembly method, or such as an electrically conductive polymer bump contact. The link elements thus help to ensure the mechanical cohesion of the assembly.

In the event of the electronic device being used to detect electromagnetic radiation, the link elements 301, 310 may constitute the anodic poles of their respective electronic components. Thus, the charge carriers released during the interactions between photons and matter in the components 303, 311 may be led towards the sensing circuit. Such an electronic radiation detector then has, conventionally, components in the overall shape of a regular polygon, such as for example a parallelepiped shape based on a rectangle, square, hexagon or triangle, each corresponding to one pixel of the matrix detector.

In accordance with the invention, each component 303, 311 is additionally electrically connected to at least one of the components which is adjacent to it. This electrical connection is obtained by means of at least one resiliently distortable conductor 305-307. The conductor 305-307 may thus fulfill the electrical contact pickup function on one of the surfaces of each electronic component.

What is more, the conductor 305-307 is so resilient that it is able to absorb distortions caused by the thermomechanical stresses created during differential expansion of the components 303, 311 and the substrate 302. Indeed, as disclosed in relation to the prior art, in the event of a difference in the expansion of the materials constituting the substrate 302 and the components 303,311, a relative displacement can be observed between these elements. These stresses mainly comprise shear stresses, but they may also comprise creep stresses etc.

In the example in FIG. 3, the conductor 305-307 is substantially in the form of a blade, in other words it is not very thick and of great width when considered in a direction perpendicular to the plane in FIG. 3. The conductor 305-307 thus has in fact the same electrical potential at all points of the detector shown in FIG. 3, since it is in the form of a grid like the device shown in a view from above in FIG. 6e.

The conductor 305-307 thus takes on the appearance of a continuous strip or film forming a contact on an extended surface of the sides of each component 303, 311. Such a surface-based contact has the advantage of offering low electric resistance to the flow of the charge carriers towards the conductor 305-307, which can form the cathode common to the detection device in FIG. 3. This consequently allows a high signal to noise ratio to be retained limiting signal degradation in each electronic component through the elimination of stresses in the active materials. What is more, it allows an increase in the quantum efficiency of the device and decreased electrical intermodulation (leakage currents) between neighbouring devices.

Here we can see a matrix of individual electronic components 303, 311 connected by bridges made out of functional material, in this case the conductors 305-307.

Furthermore, the contact pickup of the conductor 305-307 on the sides 304, 308 and 309 of each pixel can be obtained directly or through a connection means associated with the respective components 303, 311.

In practice, the conductor comprises at least two layers; on the one hand, a cohesion layer allowing its assembly with the relevant component at contact pickup level and, on the other hand, an electrical conduction layer used, by definition, to transfer the charge carriers in a collection channel common to all or part of the pixels of the detector.

The cohesion or "lock-on" layer is composed as it happens of titanium (Ti), but it could also be constituted of another material known for its cohesive properties, such as chrome (Cr). The conduction layer is constituted of a good electrical conductor material, such as platinum (Pt), gold (Au), aluminium (Al), copper (Cu) or an alloy of copper and beryllium (CuBe).

Nonetheless, without however departing from the scope of the present invention, it is conceivable to produce the resilient conductor in a semi-conductor material. This means that one single material can be used to fulfill the electrical conduction and mechanical cohesion functions.

Figure 4:
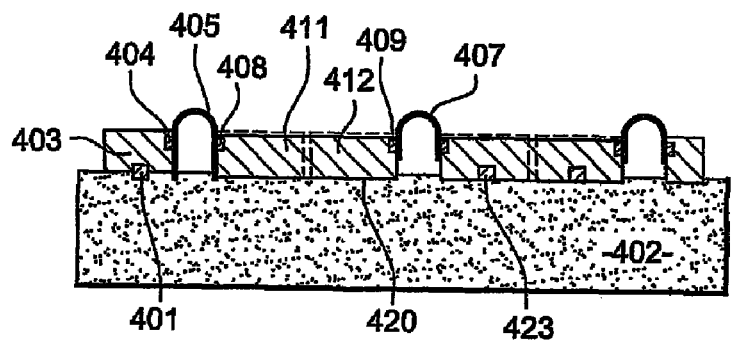
FIG. 4 is a diagrammatic representation in cross-section of a second electronic device comprising a matrix of electronic components in accordance with the invention.

FIG. 4 shows a second embodiment of the invention wherein components 403, 411, 412 are electrically connected to a substrate 402 of the CMOS type. What is more, the components 403, 411, 412 are mechanically linked to the substrate 402 by means of link elements 401, 423 inserted at the bottom of the cavities 420 provided on the surface of the substrate 402. Such link elements 401, 423 thereby constitute a sort of connector allowing cold connection and avoiding the heating required for welding.

What is more, as with the electronic device shown in FIG. 3, a resilient conductor 405, 407 allows adjacent components 403 et 411 to be connected electrically to each other. As in the case in FIG. 3, the conductor 405, 407 is resilient enough to withstand most of the thermomechanical stresses caused by differences in expansion between the materials of the elements constituting the electronic device in FIG. 4.

Unlike the electronic device shown in FIG. 3, the one shown in FIG. 4 comprises pixels placed side by side in twos 411, 412 thereby constituting a block fitted on its sides with contact pickups 408-409 with the conductor 405, 407. This embodiment means that the components 411, 412 can be put together in "islands" and, therefore, that the number of connections can be reduced and the method of manufacturing the electronic device can be simplified. Additionally, it means the active surface can be increased. However, the electronic components 403 located on the peripheral area of the substrate 402 remain individualized and have a contact pickup 404 with the conductor 405.

Here we have a matrix according to the invention comprising individual electronic components 403, 411 linked by bridges of finctional material, in this case the conductors 405-407.

Figure 5A:
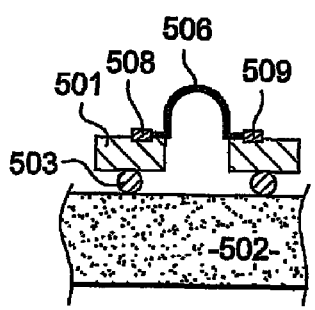
FIGS. 5a to 5c are diagrammatic representations in cross-section of devices comprising a matrix of electronic components in accordance with the invention each having an alternative location for the electrical contact pickups.
Figure 5B:
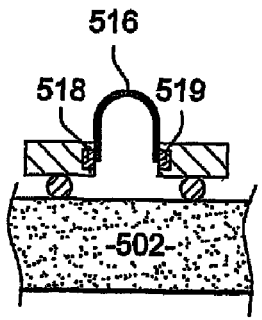
Figure 5C:
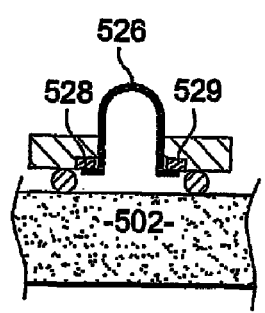

FIGS. 5a, 5b and 5c show respectively an alternative for the contact pickup of the resilient conductors 506, 516, 526 on different faces of the components 501 forming the electronic device.

Thus, in FIG. 5a, the contact pickups 508, 509 are formed on the faces of the components 501 opposite their face applied onto the substrate 502. This means on the one hand that the space taken up by the electrical connections on the lower face of a pixel can be reduced and, on the other hand, that component compactness can be increased by reducing the gap required between neighbouring components.

In the case in FIG. 5c, the contact pickups 528, 529 are formed on the faces of the components applied onto the substrate 502, in other words on the lower faces located facing this substrate 502 and receiving the link elements particularly mechanical ones, such as the brazing balls 503, particularly when this face already has contact pickups. This allows the upper face of the components to be freed up as far as possible.

FIG. 5b shows an alternative where the contact pickups 518, 519 are formed on the sides or lateral faces of each component, as with the electronic devices shown in FIGS. 3 and 4. Such an alternative frees up the upper and lower surfaces of each component, thereby maximizing the "active" volume for detection or emission.

FIGS. 6a to 6d show different successive steps in one embodiment of the method of manufacturing an electronic device according to the invention. In accordance with the invention, the method shown in FIG. 6 comprises firstly producing an active layer 601 by epitaxy on a sacrificial stratum 600; the layer is said to be active, since it fulfills the main function of the component, for example by interacting with the incident photons to release charge carriers in the case of the pixels of a detector.

Functional elements 603 characteristic of the components 611 are then deposited and/or implanted on the free surface of this active layer 601; as it happens, these are individual anodes and a metallization layer allowing each component 611 to be hybridized.

The trenches 620 are then etched in rows and in columns in the active layer 601 at least until the stratum 600 emerges, in such a way as to individualize the components 611 within a matrix.

An electrically conductive bump contact is produced on the sides or lateral faces of the individualized components 611, in such a way as to form contact pickups 608, 609; these sides may be termed "free", since they emerge from the substrate.

An electrically conductive film 606, extending over the etched trenches 620 is then deposited, using the so-called "lift-off" technique for example, in such a way as to connect the contact pickups 608, 609 of the adjacent components 611 to each other.

In accordance with the invention, the thickness of this film 606 is determined in such a way as to provide it with enough resilience to maintain the electrical connection despite a relative displacement between components 611 in the event of expansion difference within the device.

The components 611 are then hybridized on the substrate 602, here constituted by a CMOS circuit, and then the faces of each component 611 located facing the substrate 602 are selectively thinned down, in such a way as to leave the functional elements 603 in projection.

Finally the stratum 600 is removed using a chemical attack, in such a way as to reveal the electrically conductive film 606.

It can thus be observed that the different steps in producing the active layer, etching the trenches and depositing the functional film are implemented in accordance with the method of the invention, described in relation to FIGS. 1a to 1h.

Subsequently, provision may be made to add a collection means 630 common to all the pixels of the detector, in such a way as to form a cathode output channel for example.

Such a method therefore allows an electronic device according to the invention to be manufactured in a straightforward and cost effective way.

This method can thus be applied to a CMOS wafer from a silicon (Si) foundry, on which pre-treated detection circuits, or sensors, are collectively hybridized.

To implement the chemical attack of the step of removing the stratum 600, the stratum can be machined mechanically to a thickness of 10 μm before etching with fluorinated plasma the residual layer of germanium until the metal at the bottom of the trench 620 is reached. In doing this, it is desirable to protect the other exposed parts of the electronic device, such as the CMOS sensing circuit, or the edges of the sensors or detection circuits.

FIGS. 7a to 7f show a sequence of steps that may be implemented in the context of the method described above and comprising:

- depositing a layer of electrically insulating material 741 covering the whole surface of the active layer 701, namely that of a trench 720 made by etching and that of the components 701;
- piercing said layer of electrically insulating material 741 by photolithography followed by an etching operation performed at the bottom and on one part of the edges of this trench 720; thus, the free "upper" part of each pixel is stripped of insulating material;
- depositing an electrically conductive film 706 over the whole free surface of the components 701 and over the whole surface of the trenches 720;
- locally removing the electrically conductive film 706 by etching the surfaces of the components 701.

Such a sequence of steps makes it possible to position the contact pickup area between the conductive film 706 and the pixels 701 at the bottom of the trench 720, and therefore on the free surface of each of the components 701, in other words the surface located opposite the face applied onto the substrate not shown in the FIG. 7. The contact pickups are thus moved away from the active part 701 of a component, thereby limiting the risk of electrical disturbance, since too close a proximity induces electrical interference.

It is thus possible to produce a matrix detector of 2000× 2000 pixels with a pitch of between 15 μm and 20 μm, which constitutes a square detector with 4 cm sides. In such a detector expansion can reach 18 μm in the diagonal direction for temperatures dropping from ambient temperature to 77 K. In fact, with such a pixel pitch, it is very difficult if not impossible to implement two links per component, in other words per pixel, in the conventional manner shown in FIG. 2a or 2b. It is however possible to manufacture, using the manufacturing method, an electronic device in accordance with the invention which is completely finctional in order to constitute an electronic radiation detector.

Thus, during a temperature deviation, whether it is rising or falling, the expansion behaviour of the electronic device of the invention allows the thermomechanical stresses to be transmitted to the resilient conductor. Each electronic component individually follows the displacement due to the overall expansion of the material constituting the substrate.

What is more, the mechanical and thermal stresses imposed locally by the substrate on each electronic component through the resilient conductor are relatively small and can even be reduced to a negligible value in the event of the material constituting the resilient conductor being relatively soft like indium (In) and/or in the event of the resilient conductor being anchored to each component at the centre of the face receiving it. During expansion, it is the resilient conductor which distorts and locally "absorbs" the mechanical stresses due to the differential expansion between components and substrate.

Apart from this significant advantage of resistance to expansion, the electronic device of the present invention makes it possible to reduce, for example from two to one, the number of mechanical and electrical link elements required on the face of each component added to the substrate. Consequently, it is possible for such an electronic device to be miniaturized.

Furthermore, a device in accordance with the invention also has the advantage that it can be integrated, by being bonded over its whole surface for example, onto a support whereof the coefficient of expansion does not depend on the electronic device. Thus, no mechanical stress exerted by a cold, plane object on the sensing substrate is transmitted to the pixels, since these are now mechanically decoupled from the substrate.

Should the need arise, it is also possible to deposit an antireflection layer on the resilient conductor film in such a way as to avoid interference with the signals coming from the directly incident or emitted photons.

Other embodiments of the invention are possible without however departing from the scope of this invention. The components forming detection pixels can thus be replaced, as indicated above, by elementary laser emitters such as vertical-cavity surface-emitting lasers (known by the abbreviation VCSEL) or light-emitting diodes (or LED).

In other words, in the context of resolving the problems disclosed in relation to FIGS. 2a and 2b, the application that has just been described of the invention to an electronic matrix device, whereof the matrix of individualized electronic components is hybridized on a sensing substrate, may be summarized as follows.

First of all, this application relates to an electronic device, whereof the constituent elements, component and/or substrate, are subject to relatively low thermomechanical stresses, whereof the electrical connections resist differential expansion particularly at the utilization stage and do not constitute a limit to the miniaturisation of the electronic components.

The electronic device forming the subject matter of this application comprises a plurality of individualized electronic components added to a substrate, each component being mechanically linked to the substrate by a link element. Each component is additionally electrically connected to at least one adjacent component by means of at least one conductor fulfilling the electrical contact pickup function, said conductor being resilient enough to maintain the electrical connection despite a relative displacement between components.

In other words, the electronic components are all connected together electrically by means of at least one "flexible" conductor that picks up the thermomechanical stresses caused by differential expansion between elements of the device. What is more, such a conductor fulfills the electrical contact pickup function between the electronic components, which means that the number of mechanical and electrical link elements between the substrate and each electronic component can be limited to one. Consequently, the reduced space required by the link elements means that the electronic components can be miniaturised.

According to a first embodiment, this conductor may be filiform. A conductor structure of this kind means that electrical contact pickups that take up little room can be formed on the surface of each electronic component.

A simple "wire" may thus connect two neighbouring electronic components.

According to a second embodiment, this conductor may be a surface-based conductor. By surface-based conductor is meant an extended surface part, as opposed to a filiform part. The term surface-based part can thus be used to describe a film, a strip or a thin plate.

In other words, such a conductor allows an electrical contact pickup over a relatively extensive surface of each electronic component, which reduces the electrical resistance of such a contact.

In practice, the conductor may be in contact with an electrical contact pickup.

According to a practical embodiment, each component may have the overall shape of a regular polygon, such as for example a parallelepiped shape based on a rectangle, a square, a hexagon or a triangle.

Such a shape allows a matrix to be produced wherein each component acts as a pixel.

In this practical embodiment, the contact pickup may be formed on one of the lateral faces of the components.

This means that two adjacent electronic components can be connected electrically in a relatively straightforward and therefore cost effective way. Lateral face is taken to mean a face perpendicular to the face of the component located facing the substrate.

According to this practical embodiment, the contact pickup can be formed on the component face opposite the component face applied onto the substrate; in other words, on the upper face of the component when this is laid onto its substrate.

A contact pickup of this type means that the gap separating two electronic components can be reduced to the maximum thereby increasing the compactness of the components.

According to another alternative of this practical embodiment, the contact pickup can also be formed on the component face applied onto the substrate, in other words, on the lower face of the component when this is laid onto its substrate. This is particularly advantageous when the contact pickup is already available on this face, for example in the event of appropriate local doping.

According to one embodiment, the conductor may be constituted of several layers, including an electrical conduction layer and a cohesion layer intended to allow assembly on the contact pickup.

This multilayer structure allows a dissociation of the two functions that must be fulfilled by the conductor, namely electrical conduction between components and the resilience required in order to accept the thermomechanical stress of differential expansion.

Each of the layers of the conductor is thus able to properly fulfill one or other of these functions.

In practice, the external layer may be constituted of a material selected from the group comprising titanium (Ti), chrome (Cr) and an alloy (TiW) of titanium and tungsten, and the conduction layer may be constituted of a material selected from the group comprising platinum (Pt), gold (Au), aluminium (Al), copper (Cu) or an alloy of copper and beryllium (CuBe).

Such materials allow a conductor to be produced that suitably fulfills its functions.

According to one particular embodiment, the conductor is common to all or part of the components, with the conductor forming for example a continuous line or a grid.

Such a characteristic allows the conductor to be produced in a relatively straightforward and cost effective way, in order to constitute the cathode of a detector for example.

Furthermore, the application relates to a detector of electromagnetic radiation, such as X-rays, infrared or visible light. According to the application, such a detector comprises a matrix formed by a device as previously described, wherein each component comprises a material able to interact with this radiation.

A detector so constituted may offer a high level of miniaturization while resisting the mechanical stresses caused by differential expansion between its constituent elements.

In practice, the substrate of this detector may be constituted by a semi-conductor circuit using CMOS technology, and the material able to interact with said radiation may be an alloy of cadmium (Cd), mercury (Hg) and tellurium (Te), InGaAs, InSb, Si or Ge. Such a detector offers detection performance compatible with a high degree of miniaturization.

On the other hand, the application relates to an emitter of electromagnetic radiation, such as laser beams, that comprises a matrix formed by a device as previously described, wherein each component is constituted by a vertical-cavity surface-emitting laser emitter (VCSEL) or a light-emitting diode (LED).

An emitter so constituted is able to offer a high degree of miniaturization.

Furthermore, the application also relates to a method of manufacturing an electronic device that comprises a plurality of electronic components added to a substrate. The method of the invention comprises the sequence of steps of:
  producing an active layer by epitaxy on a sacrificial stratum;
  depositing and/or implanting on the free surface of this active layer functional elements characteristic of these components, such as an anode and/or a metallization layer allowing each component to be hybridized;
  etching trenches in rows and/or in columns in this active layer at least until this stratum emerges, in such a way as to individualize these components within a matrix;
  producing an electrically conductive bump contact on at least one of the free faces of each component so individualized, so as to form contact pickups;
  depositing, using the so-called lift-off technique for example, at least one electrically conductive film extending over these trenches in such a way as to connect at least in twos the contact pickups of adjacent components, this film being of a set thickness in order to give it enough resilience to maintain the electrical connection despite a relative displacement between components;

hybridizing the components on the substrate, such as a CMOS semi-conductor circuit;

selectively thinning down the faces of each component located facing the substrate, in such a way as to leave all or part of these functional elements in projection;

removing the stratum using mechanical machining or chemical attack, in such a way as to reveal the electrically conductive film.

In other words, after etching the trenches and forming the contact pickups, the method forming the subject matter of the invention comprises depositing a film suitable for forming a flexible conductor between the components and, possibly, the substrate.

In practice, the deposition step may comprise the sequence of steps of:

depositing a layer of electrically insulating material covering the whole surface of the active layer, namely that of the trench and that of the components;

piercing the layer of electrically insulating material by photolithography followed by an etching operation performed at the bottom and over all or part of the edges of said trench;

depositing the electrically conductive film over all or part of the free surface of the components and trenches;

locally removing the electrically conductive film by etching the surfaces of the components.

Such a manufacturing method allows the electrical contact pickup to be formed in the free part of each of the electronic components, in such a way as to reduce the degradation of the signal of each component caused by disturbance and leaks of the charge carriers between pixels. "Free" is taken to mean the part of the surface of a component which is not covered by the substrate, and therefore its lateral and upper faces.

According to one particular embodiment, the conductor may be constituted of several layers, including an electrical conduction layer and a cohesion layer intended to allow assembly on the contact pickup. What is more, the removal step may be carried out using a plasma selected in such a way as to be inert at least in respect of this conduction layer.

This means that a good quality conductor can be produced at relatively low cost.

An application of the invention has been described dedicated to the manufacture of a matrix detector wherein the function of the bridges 305, 307, 405, 407, 606 is to achieve an electrical interconnection between adjacent electronic components 303, 311, 403, 411, 611 and to secure said interconnections in the event of the relative displacement thereof.

Figure 6A:
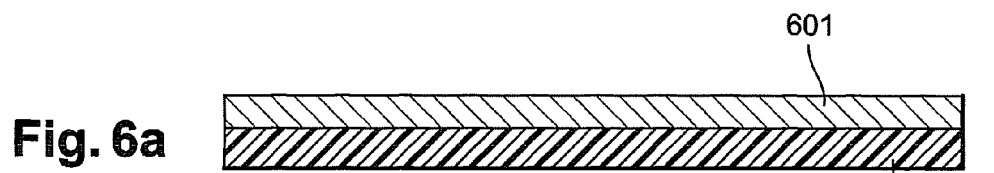
FIGS. 6a to 6d are diagrammatic representations in cross-section showing different steps in the method of manufacturing the devices in FIGS. 3 and 4.
Figure 6B:
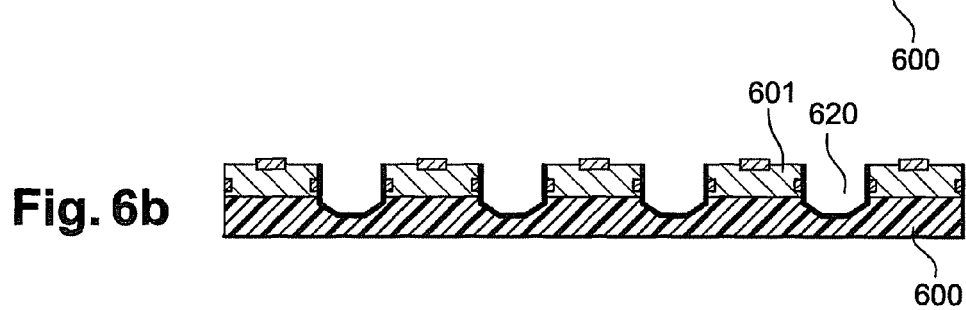
Figure 6C:
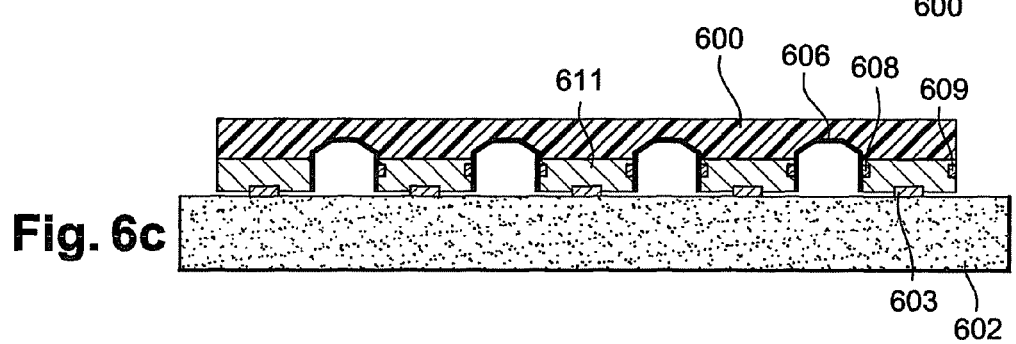
Figure 6D:
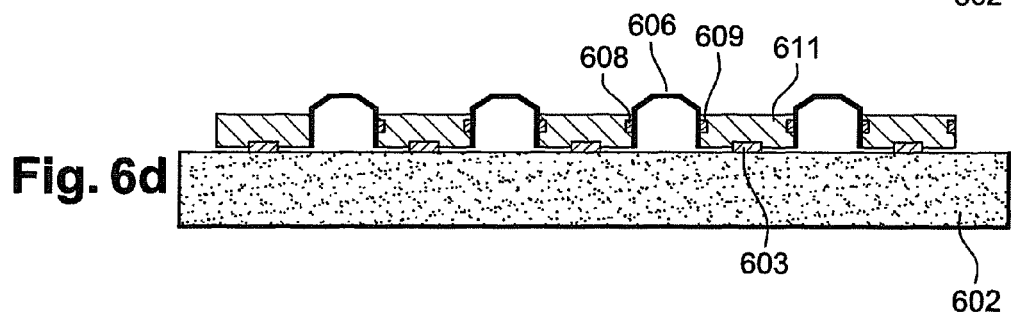
Figure 6E:
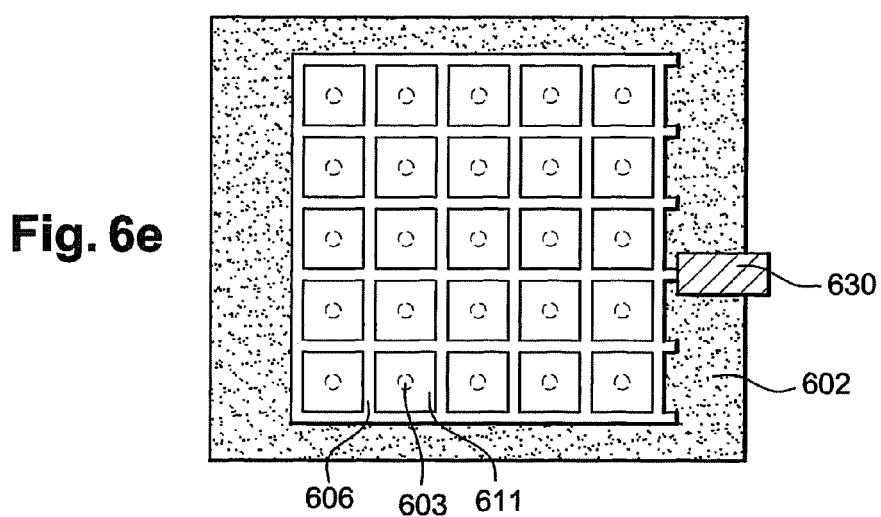
FIG. 6e is a view from above of the electronic device shown in FIG. 6d.

By selecting an opaque material for these bridges 305, 307, 405, 407, 606, a perfect optical isolation of the photosensitive components 303, 311, 403, 411 is obtained. As can be seen in FIG. 6e, it is noted that only the upper faces of the electronic components 611 are free to be exposed to incident radiation since the space between these components is protected optically by the bridge 606.

Figure 8:
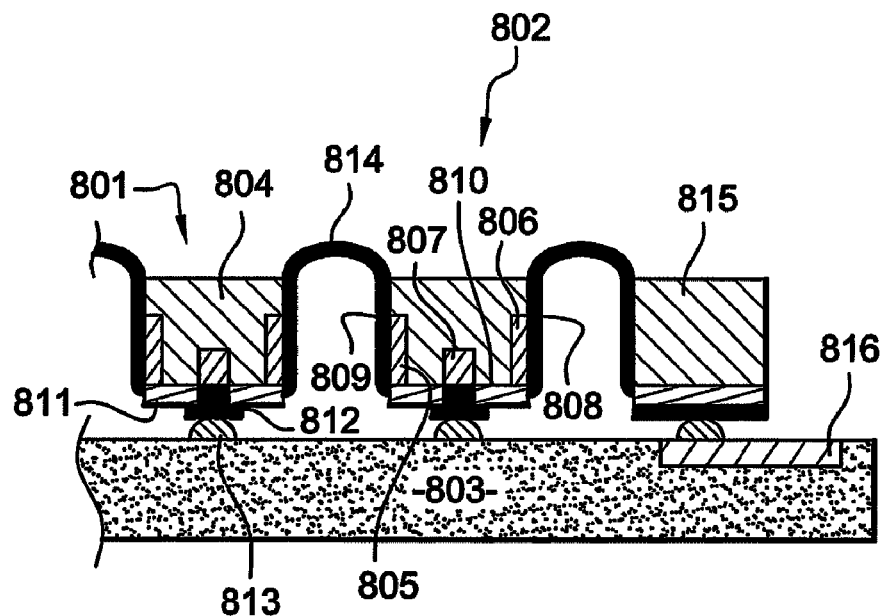
FIG. 8 is a diagrammatic representation in cross-section of a third electronic device comprising a matrix of electronic components in accordance with the invention.
Figure 9:
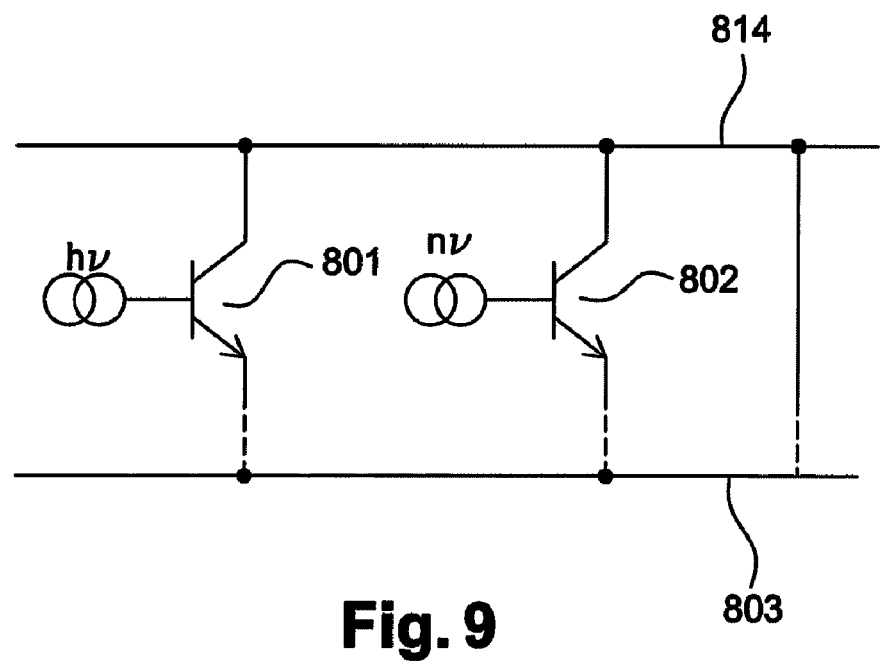
FIG. 9 is an electronic representation of the device in FIG. 8.
Figure 10A:
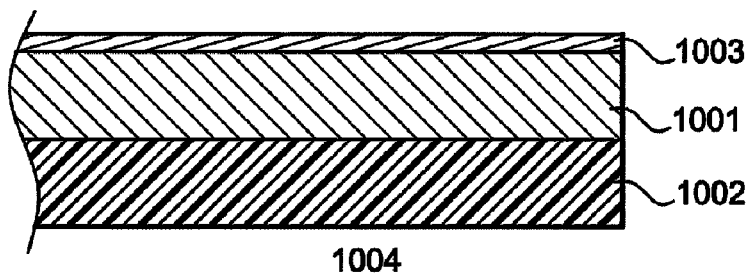
FIGS. 10a to 10e show a method of manufacturing the device in FIG. 8.
Figure 10B:
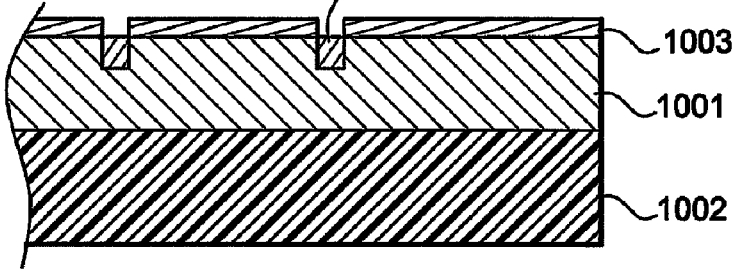
Figure 10C:
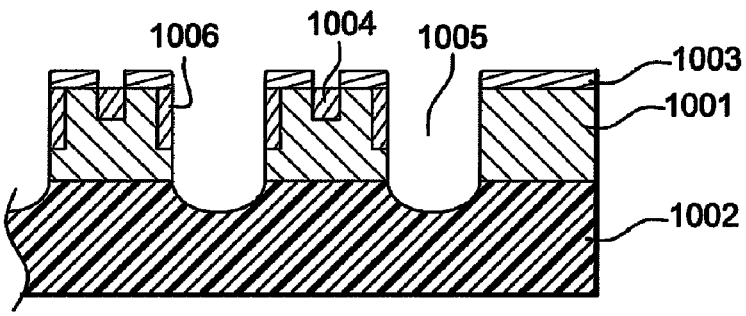
Figure 10D:
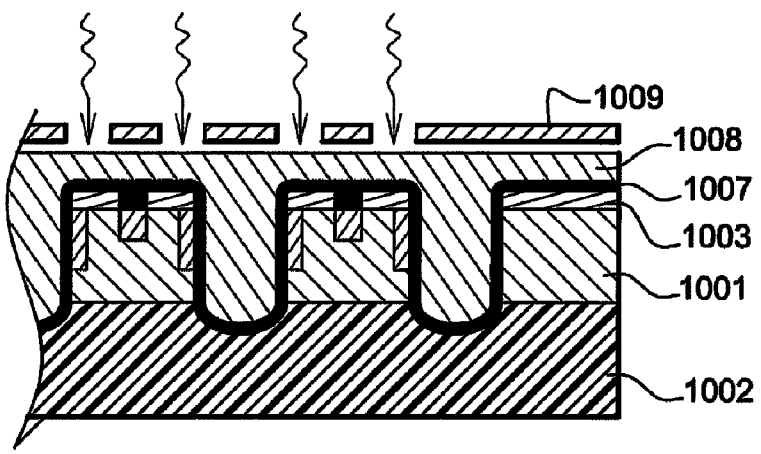
Figure 10E:
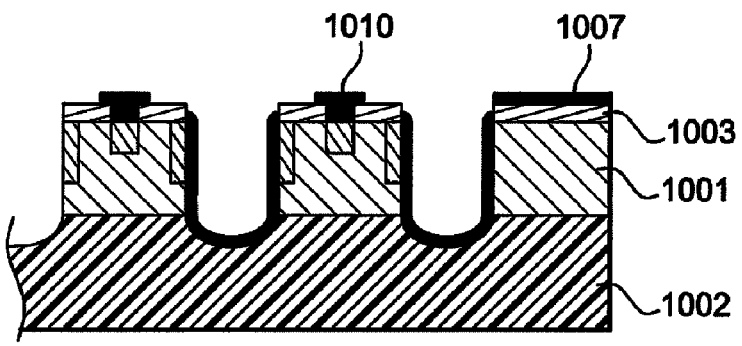

Second Particular Application of the Method and Matrix According to the Invention FIGS. 8 to 10 show an application similar to the one described in relation to FIGS. 2 to 7. The second application differs from the first mainly in that the electronic components are bipolar transistors or diodes.

It will therefore be understood that what has been described in relation to FIGS. 2 to 7 also applies to the application described below, only requiring, where appropriate, minor modifications well within the scope of the man skilled in the art.

In FIG. 8, a detector is shown that comprises a matrix of bipolar transistors 801, 802 in a common collector arrangement hybridized on a sensing substrate 803. Consideration will now be given to the example of NPN transistors. Clearly what follows also applies to PNP transistors.

Each transistor 801, 802 is produced in a block 804 made out of a material able to interact with an electromagnetic radiation for detection and which is P-doped, for example a P-doped alloy of cadmium (Cd), mercury (Hg) and tellurium (Te), suitable for detecting infrared beams.

Each transistor 801, 802 further comprises three areas 805, 806, 807 formed in the block 804, whereof the first two 805, 806 emerge on the lateral faces 808, 809 of the transistor, and whereof a third 807 emerges on the face 810 of the block 804 that is applied onto the substrate 803. The areas 805, 806, 807 are formed out of the same material as the block 804, except that they are N-doped.

The face of the block 804 that is applied onto the substrate 803 is furthermore covered with an antireflection layer 811 comprising an aperture 812 emerging on the third area 807. The aperture 807 is filled with a conductive material, in platinum (Pt) or gold (Au) for example.

The substrate 803 itself is constituted by a CMOS type semi-conductor sensing circuit, as is generally the case for matrix detectors of electromagnetic radiation.

Each transistor 801, 802 is linked mechanically and connected electrically to the substrate 803 by means of a link element 813, such as a brazing ball used as part of the "flip-chip" assembly method, or such as an electrically conductive polymer bump contact. The link elements thus help to ensure the mechanical cohesion of the assembly.

Each transistor 802, 803 is additionally electrically connected to at least one of the transistors which is adjacent to it by means of at least one resiliently distortable conductor 814, and connected to an N-doped lateral area 805, 806 of each of these transistors. The conductor 814 complies with the one described in relation to FIGS. 3 to 7 and produced using the method of the invention.

The conductor 814 may thus be filiform or surface-based. The conductor may also be common to all the transistors and formed all in one piece.

Finally, the matrix comprises at each row and/or column end a component 815 ensuring the electrical pickup of the conductor 814 of the transistor which is adjacent to it with a common mode collector connection area of the sensing substrate 803.

The N-doped areas 805, 806, 807 and the P-doped block 804 of each transistor 801, 802 thus form the constituent PN and NP junctions of a bipolar transistor. The bipolar transistors so formed additionally have their collector connected in common by the conductors 814. A conductor 814 between two adjacent transistors is therefore in contact pickup on lateral faces thereof.

The bases of the transistors are floating and subject to radiation. The electronic diagram equivalent to the matrix in FIG. 8 is shown in FIG. 9.

As an alternative, the area 807 is not doped relative to the block 804. A simplified configuration of the diode type is thus obtained.

A method of manufacturing the device in FIG. 8 is shown in FIGS. 10a to 10e, and comprises the sequence of steps of:

forming by epitaxy a P-type active layer 1001 on a sacrificial stratum 1002;

forming by epitaxy a layer 1003 of antireflection material on the free face of the active layer 1001;

forming, for each transistor, an N-type area 1004 in the active layer 1001, for example by means of an ion implantation or machining;

etching trenches 1005 around the N-type areas 1004, in such a way as to form a matrix of individual transistors, and form in the sides or lateral faces of the individual transistors N-type areas 1006, in such a way as to form the collectors of said transistors. In the particular case of CdHgTe, the areas 1006 are for example simultaneously etched and formed using the so-called "loophole" technique described in the document "Summary of HgCdTe 2D array technology in the UK" by Baker I. M. and Maxey C. D., Journal of Electronic Materials, vol. 90, no. 6, 2001;

performing a dual layer metallization 1007 over the whole surface of the etched assembly, in such a way as to form a conductive and resilient film using a so-called "lift-off" technique; this metallization 1007 comprises for example making a deposition of a first contact and lock-on layer in titanium or chrome, followed by the deposition of a second conduction layer in platinum or gold, as has been previously explained;

covering the assembly with photosensitive resin and subjecting it to UV radiation exposure through a photolithography mask masking the resin covering the N-type areas 1004 on the upper face of the transistors and the resin of the trenches;

developing the exposed resin, etching the metallization 1007 showing through after development and removing the residual resin;

hybridizing the assembly on a CMOS sensing circuit using so-called "flip-chip" technology; and removing the stratum 1002 using a chemical and/or mechanical attack, in such a way as to reveal the metallization of the trenches.

The steps of metallization, resin deposition, exposure, development and etching are carried out in accordance with the method described in relation to FIGS. 1a to 1i.

Preferably the removal of the sacrificial stratum comprises steps of:

mechanically thinning down the sacrificial stratum 1002 in such a way as to leave a thin residual layer of stratum above the metallization of the trenches, of less than 10 micrometers for example; and etching in fluorinated plasma the residual layer of stratum as far as the trench metallization taking care to protect the other parts of the device.

A matrix of bipolar transistors is thus obtained which offers the following advantages:

pixel size is reduced. Indeed, only one connection is provided on the upper face of the device which gives a smaller pitch when constituting a matrix;

transistor access resistance is reduced since the connection to the transistors is not provided through the active layer. Additionally the effective cross-section of the connections between the transistors is increased due to a significant surface of the conductive film between them;

the double layer film is opaque and flexible;

the double layer film exactly covers the trenches.

The invention claimed is:

1. A matrix of at least two electronic components individualized in an active layer by means of through trenches formed therein, comprising, for each pair of adjacent electronic components, at least one element connected to said pair of adjacent electronic components, at least partially covering the through trench separating said pair of adjacent electronic components, and housing at least one point of contact with each of the lateral walls defining said through trench, wherein said at least one element is conductive and has sufficient resilience to maintain the integrity of the electrical connection between said pair of adjacent electronic components even when there is relative displacement between the adjacent electronic components.

2. The matrix as claimed in claim 1, wherein each component has the overall shape of a regular polygon, particularly a rectangle-based parallelepiped shape.

3. The matrix as claimed in claim 1, wherein said element is opaque.

4. The matrix as claimed in claim 1, wherein said element is filiform.

5. The matrix as claimed in claim 1, wherein said element is surface-based.

6. The matrix as claimed in claim 1, wherein said element is in contact with an electrical contact pickup.

7. The matrix as claimed in claim 6, wherein said contact pickup is formed on one of the lateral faces of the component under consideration.

8. The matrix as claimed in claim 6, wherein said contact pickup is formed on one of the transverse faces of the component under consideration.

9. The matrix as claimed in claim 1, wherein said element is constituted of several layers, including an electrical conduction layer and a cohesion layer intended to allow assembly on the contact pickup.

10. The matrix as claimed in claim 9, wherein the external layer is constituted of a material selected from the group comprising titanium (Ti), chrome (Cr) and an alloy (TiW) of titanium and tungsten, and in that the conduction layer is constituted of a material selected from the group comprising platinum, gold, aluminium, copper or an alloy of copper and beryllium.

11. The matrix as claimed in claim 1, wherein said element is common to all or part of said components and forms a continuous line or grid.

12. The matrix as claimed in claim 1, wherein each electronic component is a bipolar transistor, whereof at least one semi-conductor area is formed in one of the lateral faces thereof and is in contact with said element.

13. An Electronic device comprising a plurality of electronic components added to a substrate, each component being mechanically connected to said substrate by means of a link element, wherein each component is additionally electrically connected to at least one adjacent component by means of a part forming a conductor, and wherein the components and associated conductors thereof form a matrix in accordance with claim 1.

14. The electronic device as claimed in claim 13, wherein said contact pickup is formed on the component face opposite the component face that is applied onto said substrate.

15. The electronic device as claimed in claim 13, wherein said contact pickup is formed on the component face that is applied onto said substrate.

16. The electronic device as claimed in claim 13, wherein the component is a transistor or a diode.

17. A detector of electromagnetic radiation, such as X-rays, infrared rays or visible light, wherein it comprises a device as claimed in claim 13, and wherein each component comprises a material able to interact with the radiation under consideration.

18. An emitter of electromagnetic radiation, such as laser beams, wherein it comprises a device as claimed in claim 13, and wherein each component is constituted by a vertical-cavity surface-emitting laser emitter (VCSEL) or a light-emitting diode.

19. The matrix as claimed in claim 1, wherein the at least one element has a substantially inverted U-shape.

20. The matrix as claimed in claim 19, wherein the at least one element contacts less than an entirety of a lower portion of the through trench.

* * * * *